US012660416B2

(12) United States Patent
Zhao et al.

(10) Patent No.: US 12,660,416 B2
(45) Date of Patent: Jun. 16, 2026

(54) LIGHT-TRANSMITTING DISPLAY PANEL AND DISPLAY PANEL HAVING ARCUATE ARRANGEMENT STRUCTURE

(71) Applicant: KunShan Go-Visionox Opto-Electronics Co., Ltd, Kunshan (CN)

(72) Inventors: Gaina Zhao, Kunshan (CN); Xuyang Fang, Kunshan (CN); Xiaoling Li, Kunshan (CN); Rubo Xing, Kunshan (CN); Rusheng Liu, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 943 days.

(21) Appl. No.: 17/584,833

(22) Filed: Jan. 26, 2022

(65) Prior Publication Data

US 2022/0149120 A1      May 12, 2022

Related U.S. Application Data

(63) Continuation of application No. PCT/CN2020/120402, filed on Oct. 12, 2020.

(30) Foreign Application Priority Data

Dec. 24, 2019     (CN) .......................... 201911348304.6

(51) Int. Cl.
*H10K 59/121*          (2023.01)
*H10K 59/35*           (2023.01)
(Continued)

(52) U.S. Cl.
CPC ......... *H10K 59/121* (2023.02); *H10K 59/353* (2023.02); *H10K 59/80518* (2023.02); *H10K 59/65* (2023.02); *H10K 2102/103* (2023.02)

(58) Field of Classification Search
CPC ............... H10K 59/121; H10K 59/353; H10K 59/80518; H10K 2102/103; H10K 59/65; H10K 59/60
See application file for complete search history.

(56) References Cited

U.S. PATENT DOCUMENTS

| 2014/0003045 A1 | 1/2014 | Lee et al. |
| 2014/0042887 A1 | 2/2014 | Ko |

(Continued)

FOREIGN PATENT DOCUMENTS

| CN | 107154417 A | 9/2017 |
| CN | 108269840 A | 7/2018 |

(Continued)

OTHER PUBLICATIONS

Improved translation of IDS ref. CN208622778, published Mar. 19, 2019.*

(Continued)

*Primary Examiner* — Suberr L Chi
(74) *Attorney, Agent, or Firm* — Maier & Maier, PLLC

(57) ABSTRACT

A light-transmitting display panel, display panel and display apparatus. The light-transmitting display panel includes a first pixel array including a first minimum repeating unit. The first minimum repeating unit includes at least one light-transmitting column unit. The at least one light-transmitting column unit has a central axis parallel to an extending direction of the at least one light-transmitting column unit. The at least one light-transmitting column unit includes a plurality of first sub-pixels spaced apart from one another in the extending direction of the at least one light-transmitting column unit. At least one of the first sub-pixels in the at least one light-transmitting column unit is set to deviate from the central axis.

19 Claims, 7 Drawing Sheets

(51) Int. Cl.
  *H10K 59/80* (2023.01)
  *H10K 59/65* (2023.01)
  *H10K 102/10* (2023.01)

(56) References Cited

U.S. PATENT DOCUMENTS

| | | | |
|---|---|---|---|
| 2015/0194634 A1 | 7/2015 | Kang et al. | |
| 2016/0178972 A1 | 6/2016 | Lo et al. | |
| 2016/0198544 A1 | 7/2016 | Chu | |
| 2017/0194390 A1 | 7/2017 | Kim | |
| 2019/0131355 A1* | 5/2019 | Chae | H10K 59/352 |
| 2019/0326366 A1 | 10/2019 | Fan et al. | |

FOREIGN PATENT DOCUMENTS

| | | |
|---|---|---|
| CN | 108364967 A | 8/2018 |
| CN | 108431885 A | 8/2018 |
| CN | 109448575 A | 3/2019 |
| CN | 208622778 U | 3/2019 |
| CN | 109599053 A | 4/2019 |
| CN | 110061014 A | 7/2019 |
| CN | 110071160 A | 7/2019 |
| CN | 110323259 A | 10/2019 |
| CN | 110444125 A | 11/2019 |
| CN | 110570774 A | 12/2019 |
| CN | 111029391 A | 4/2020 |
| EP | 2680310 A1 | 1/2014 |
| JP | 2017534085 A | 11/2017 |
| JP | 2018510389 A | 4/2018 |
| KR | 1020110080051 A | 7/2011 |
| TW | 201128771 A | 8/2011 |
| TW | 201839977 A | 11/2018 |
| TW | 201939733 A | 10/2019 |
| WO | 2018216545 A1 | 11/2018 |
| WO | 2020238343 A1 | 12/2020 |

OTHER PUBLICATIONS

The Notification to Grant Patent Rights dated Aug. 22, 2022, in corresponding to Chinese Application No. 201911348304.6; 8 pages (with English Translation).

Office Action issued on Mar. 20, 2024, in corresponding Korean Application No. 10-2022-7005121, 14 pages.

The Extended European Search Report issued on Sep. 22, 2022, in connection with corresponding European Application No. 20906853.5 (9 pages).

Office Action dated in Nov. 29, 2022, in corresponding Japanese Patent Application No. 2022-510113, 5 pages.

The International search report for PCT Application No. PCT/CN2020/120402, dated Jan. 7, 2021, 10 pages.

The First Office Action for Chinese Application No. 201911348304.6, dated Nov. 24, 2021, 17 pages.

The First Office Action for Taiwan Application No. 109136327, dated Aug. 9, 2021, 9 pages.

The Rejection Decision for Taiwan Application No. 109136327, dated Oct. 26, 2021, 9 pages.

Office Action, with partial English translation, issued on Nov. 16, 2022, in corresponding Taiwanese Patent Application No. 109136327, 5 pages.

Office Action issued on May 9, 2023, in corresponding Japanese Application No. 2022-510113, 4 pages.

\* cited by examiner

100

LIGHT-TRANSMITTING DISPLAY PANEL AND DISPLAY PANEL HAVING ARCUATE ARRANGEMENT STRUCTURE

CROSS REFERENCE TO RELATED APPLICATION

The application is a continuation of International Application No. PCT/CN2020/120402 filed on Oct. 12, 2020, which claims the priority to Chinese Patent Application No. 201911348304.6 filed on Dec. 24, 2019, both of which are incorporated herein by reference in their entireties.

TECHNICAL FIELD

The application relates to the field of display, and particularly to a light-transmitting display panel, display panel and display apparatus.

BACKGROUND

With rapid development of electronic devices, users are requiring to have higher and higher screen-to-body ratios. As a result, the industry has shown more and more interest in all-screen displays of electronic devices.

There is a need for traditional electronic devices, such as mobile phones and tablets, to have front-facing cameras, earpieces, and infrared sensing components etc. integrated thereon. In the prior art, notches or holes may be provided on display screens, so that external light can enter photosensitive elements disposed under the screens through the notches or holes on the screens. However, these electronic devices do not have actual all-screen displays, since not all regions across the screens can be used to display, for example, regions corresponding to front-facing cameras cannot be used to display.

SUMMARY

The present application provides a light-transmitting display panel, display panel and display apparatus, enabling at least some regions of the display panel to transmit light as well as display, so as to facilitate under-screen integration of photosensitive components.

In a first aspect, an embodiment of the present application provides a light-transmitting display panel. The light-transmitting display panel includes a first pixel array including a first minimum repeating unit. The first minimum repeating unit includes at least one light-transmitting column unit. The at least one light-transmitting column unit has a central axis parallel to an extending direction of the at least one light-transmitting column unit. The at least one light-transmitting column unit includes a plurality of first sub-pixels spaced apart from one another in the extending direction of the light-transmitting column unit, wherein at least one of the first sub-pixels in the at least one light-transmitting column unit is set to deviate from the central axis.

According to the light-transmitting display panel of the embodiment of the present application, photosensitive components may be integrated on the back of the light-transmitting display panel to achieve under-screen integration of the photosensitive components such as cameras, while the light-transmitting display panel can display pictures, so as to achieve a full-screen design in which the light-transmitting display panel is applied to a display apparatus.

In the first minimum repeating unit, each light-transmitting column unit includes a plurality of first sub-pixels spaced apart from one another in the extending direction of the light-transmitting column unit. At least one of the first sub-pixels in the at least one light-transmitting column unit is set to deviate from the central axis, so as to avoid a strictly and neatly collinear arrangement of each column of first sub-pixels in the first pixel array and reduce arrangement consistency of the first sub-pixels, and thus to reduce a diffraction effect on light of the light-transmitting display panel. The quality of images obtained by the photosensitive components integrated on the back of the light-transmitting display panel can be improved, and the resolution and contrast of the images obtained by the photosensitive components can be improved, by reducing the diffraction effect on light of the light-transmitting display panel.

According to the foregoing implementation of the first aspect of the present application, the plurality of first sub-pixels in the at least one light-transmitting column unit are arranged into a curved arrangement structure. Thereby, the diffraction effect on light of the light-transmitting display panel can be reduced and the quality of images obtained by the photosensitive components integrated on the back of the light-transmitting display panel can be further improved, by optimizing relative positions of the first sub-pixels.

According to any of the foregoing implementations of the first aspect of the present application, a length of a first electrode in a direction parallel to the central axis is 10 to 35 microns, and a length of the first electrode in a direction perpendicular to the central axis is 10 to 35 microns.

In a second aspect, an embodiment of the present application provides a display panel. The display panel includes a first display area and a second display area adjacent to each other. A light transmittance of the first display area is greater than a light transmittance of the second display area. The first display area of the display panel is configured to be the light-transmitting display panel of any of the forgoing implementations.

According to the foregoing implementation of the second aspect of the present application, the display panel further includes a second pixel array disposed in the second display area. The second pixel array includes a second minimum repeating unit. The second minimum repeating unit includes a plurality of opaque column units. Each of the opaque column units includes a plurality of second sub-pixels spaced apart from one another in an extending direction of the opaque column unit. The extending direction of the opaque column unit is same as the extending direction of the light-transmitting column unit. The at least one light-transmitting column unit of the first minimum repeating unit includes a plurality of light-transmitting column units. The plurality of second sub-pixels included in each of the opaque column units are set collinearly in the extending direction of the opaque column unit. A number of opaque column units in the second minimum repeating unit is identical to a number of light-transmitting column units in the first minimum repeating unit and each light-transmitting column unit and corresponding one of the opaque column units have a same shape, and in the light-transmitting column unit and the corresponding opaque column unit, the plurality of first sub-pixels and the plurality of second sub-pixels have a same color sequence.

In a third aspect, an embodiment of the present application provides a display apparatus, including the light-transmitting display panel of any of the forgoing implementations.

According to the light-transmitting display panel of the embodiments of the present application, photosensitive components may be integrated on the back of the light-transmitting display panel to achieve under-screen integration of the photosensitive components such as cameras, while the light-transmitting display panel can display pictures, so as to achieve a full-screen design in which the light-transmitting display panel is applied to a display apparatus.

In the first minimum repeating unit, each light-transmitting column unit includes a plurality of first sub-pixels spaced apart from one another in the extending direction of the light-transmitting column unit. At least one of the first sub-pixels in the at least one light-transmitting column unit is set to deviate from the central axis, so as to avoid a strictly and neatly collinear arrangement of each column of first sub-pixels in the first pixel array and reduce arrangement consistency of the first sub-pixels, and thus to reduce a diffraction effect on light of the light-transmitting display panel. The quality of images obtained by the photosensitive components integrated on the back of the light-transmitting display panel can be improved, and the resolution and contrast of the images obtained by the photosensitive components can be improved, by reducing the diffraction effect on light of the light-transmitting display panel.

In some optional implementations, the plurality of first sub-pixels in the at least one light-transmitting column unit are arranged in a curved arrangement structure. Thereby, the diffraction effect on light of the light-transmitting display panel can be reduced and the quality of images obtained by the photosensitive components integrated on the back of the light-transmitting display panel can be further improved, by optimizing relative positions of the first sub-pixels.

BRIEF DESCRIPTION OF THE DRAWINGS

Other features, objections and advantages of the present application will become more obvious, by reading the detailed description of non-limiting embodiments with reference to the accompanying drawings below, in which the same or similar reference symbols indicate the same or similar features. The accompanying drawings are not drawn to real scale.

DETAILED DESCRIPTION

In order to make the objects, technical solutions and advantages of the present application clearer, the present application is further described in details below with reference to the accompany drawings and specific embodiments. It should be understood that the specific embodiments described herein are only for illustration of the present application, and are not for limiting the present application. For those skilled in the art, the present application can be implemented without some of those specific details.

It is to be noted that relationship terms such as first, second, and the like are used herein simply to distinguish one entity or operation from another entity or operation, but do not necessarily require or imply any actual such relationship or order between these entities or operations.

In an electronic device, such as a mobile phone and a tablet etc., there is a need to integrate photosensitive components (e.g., front-facing cameras, infrared light sensors, and proximity light sensors) on the side where a display panels is provided. For example, a light-transmitting display area may be provided on the above-described electronic device, and the photosensitive components may be arranged on the back of the light-transmitting display area, such that all-screen display for the electronic device can be achieved, while proper operations of the photosensitive components can be guaranteed In the light-transmitting display area, patterned structures such as anodes and wires etc. will cause a diffraction phenomenon of light. The diffraction phenomenon causes directly a degradation in quality of images captured by the photosensitive components. The multi-order diffraction spots may enter the photosensitive components and may be captured by the photosensitive components, resulting in a decline in image resolution and contrast.

In order to solve the above problems, embodiments of the present application provide a light-transmitting display panel, display panel and display apparatus. Various embodiments of the light-transmitting display panel, display panel and display apparatus will be described below in connection with the accompanying drawings.

Embodiments of the present application provide a light-transmitting display panel, which may be an Organic Light Emitting Diode (Organic Light Emitting Diode, OLED) display panel.

The "light-transmitting display panel" used herein refers to a display panel with light transmittance greater than or equal to 15%. In order to ensure that the light transmittance of the light-transmitting display panel is greater than or equal to 15%, or even greater than 40% or more, light transmittance of at least some of functional film layers of the light-transmitting display panel in the embodiments of the present application is greater than 80%, or even greater than 90%.

Figure 1:
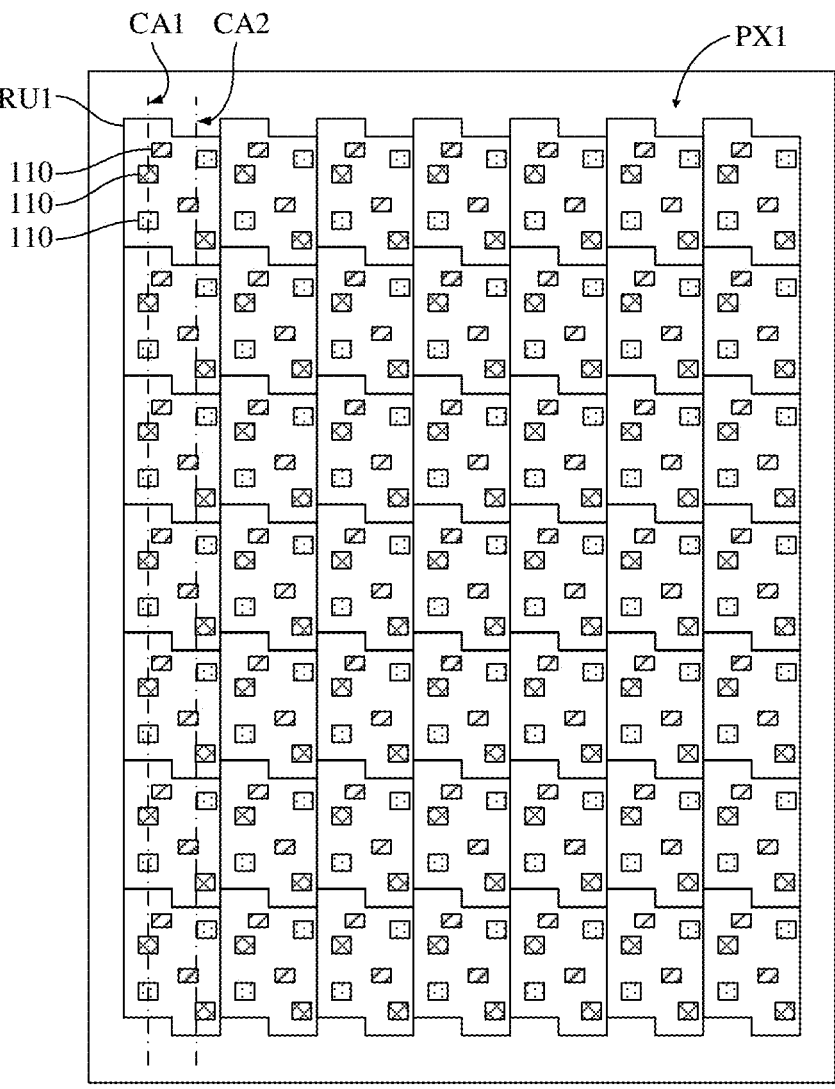
FIG. 1 is a schematic top view of a light-transmitting display panel provided by an embodiment of the present application.

FIG. 1 is a schematic top view of a light-transmitting display panel provided by an embodiment of the present application. The light-transmitting display panel 100 may include a first pixel array PX1, which includes a first minimum repeating unit RU1.

Figure 2:
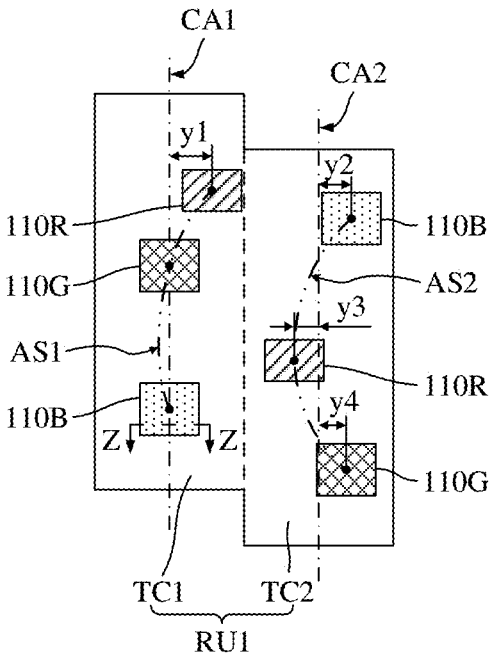
FIG. 2 is a schematic enlarged view of a first minimum repeating unit of the light-transmitting display panel provided by the embodiment of the present application.

FIG. 2 is a schematic enlarged view of a first minimum repeating unit of a light-transmitting display panel provided by an embodiment of the present application. The first minimum repeating unit RU1 includes at least one light-transmitting column unit TC1, TC2. In this embodiment, it is used as an example for illustration that the first minimum repeating unit RU1 includes a first light-transmitting column unit TC1 and a second light-transmitting column unit TC2.

The first pixel array PX1 includes a plurality of first sub-pixels 110 arranged in an array. The plurality of first sub-pixels 110 arranged in the array may be arranged in multiple rows and multiple columns. An extending direction of the rows crosses an extending direction of the columns. In some embodiments, the extension direction of the rows may be parallel approximately to an extension direction of gate lines (scanning lines) in the light-transmitting display panel 100, and the extension direction of the columns may be substantially parallel to an extension direction of data lines in the light-transmitting display panel 100.

A light-transmitting column unit refers to a regional unit obtained by further dividing a region occupied by the first minimum repeating unit in the light-transmitting display panel in columns, i.e., the first minimum repeating unit includes at least one column unit that is obtained by dividing the first minimum repeating unit in columns of the first sub-pixels 110 and is light-transmitting. Transmittance of the column unit may indicate particularly that at least a part region of the column unit can transmit light. For example, the column unit may include an emitting area corresponding to the first sub-pixel 110 and a non-emitting area surrounding the emitting area. The non-emitting area may transmit light, and the emitting area may or may not transmit light.

In some other embodiments, a number of light-transmitting column units included in each first minimum repeating unit RU1 is not limited to two as described above, and may be more.

According to the light-transmitting display panel 100 of embodiments of the present application, photosensitive components may be integrated on the back of the light-transmitting display panel 100, to achieve under-screen integration of the photosensitive components such as cameras, while the light-transmitting display panel 100 can display pictures, so as to achieve a full-screen design in which the light-transmitting display panel 100 is applied to a display apparatus.

The light-transmitting column units TC1, TC2 respectively have the central axes CA1, CA2 parallel to an extending direction of the light-transmitting column unit TC1, TC2. Each of the light-transmitting column units TC1, TC2 includes a plurality of first sub-pixels 110 spaced apart from other in the extending direction of the light-transmitting column units TC1, TC2. For example, in the embodiment, the first light-transmitting column unit TC1 has the central axis CA1 parallel to the extending direction of the first light-transmitting column unit TC1, and the second light-transmitting column unit TC2 has the central axis CA2 parallel to the extending direction of the first light-transmitting column unit TC2.

At least one of the first sub-pixels 110 in the at least one light-transmitting column unit is set to deviate from the central axis, so as to avoid a strictly and neatly collinear arrangement of each column of first sub-pixels 110 in the first pixel array PX1 and reduce arrangement consistency of the first sub-pixels 110, and thus to reduce a diffraction effect on light of the light-transmitting display panel 100. The quality of images obtained by the photosensitive components integrated on the back of the light-transmitting display panel 100 can be improved, and the resolution and contrast of the images obtained by the photosensitive components can be improved, by reducing the diffraction effect on light of the light-transmitting display panel 100.

In FIG. 2, each of center points of the first sub-pixels 110 is shown as a solid dot. In the description, arrangement of positions of the sub-pixels refers particularly arrangement of positions of the center points of the sub-pixels. For example, a first sub-pixels 110 being set to deviate from the central axis, as mentioned above, means that the center point of the first sub-pixel 110 is set to deviate from the central axis.

In some embodiments, the plurality of first sub-pixels 110 in the at least one light-transmitting column unit TC are arranged in a curved arrangement structure. In some embodiments, the plurality of first sub-pixels 110 in the at least one light-transmitting column unit TC are arranged in an arcuate arrangement structure AS.

In this embodiment, the first light-transmitting column unit TC1 includes a first sub-pixel 110R, a first sub-pixel 110G, and a first sub-pixel 110B that are spaced apart from one another in the extending direction of the first light-transmitting column unit TC1. Among the sub-pixels, the first sub-pixel 110R is a red sub-pixel, the first sub-pixel 110G is a green sub-pixel, and the first sub-pixel 110B is a blue sub-pixel. In the first light-transmitting column unit TC1, the first sub-pixel 110R is set to deviate from the central axis CA1. Particularly, as shown in FIG. 2, the first sub-pixel 110R is set to deviate rightward from the central axis CA1, and a distance from the first sub-pixel 110R of the first light-transmitting column unit TC1 to the central axis CA1 is 18.87 microns.

In this embodiment, the second light-transmitting column unit TC2 includes a first sub-pixel 110B, a first sub-pixel 110R, and first sub-pixel 110G that are spaced from one another in the extending direction of the second light-transmitting column unit TC2. Among the sub-pixels, the first sub-pixel 110R is a red sub-pixel, the first sub-pixel 110G is a green sub-pixel, and the first sub-pixel 110B is a blue sub-pixel. In the second light-transmitting column unit TC2, the first sub-pixel 110B, the first sub-pixel 110R, and the first sub-pixel 110G are all set to deviate from the central axis CA2. Particularly, as shown in FIG. 2, the first sub-pixel 110B is set to deviate rightward from the central axis CA2, and a distance y2 from the first sub-pixel 110B of the second light-transmitting column unit TC2 to the central axis CA2 is 10.38 microns. The first sub-pixel 110R is set to deviate leftward from the central axis CA2, and a distance y3 from the first sub-pixel 110R of the second light-transmitting column unit TC2 to the central axis CA2 is 9.87 microns. The first sub-pixel 110G is set to deviate rightward from the central axis CA2, and a distance y4 from the first sub-pixel 110G of the second light-transmitting column unit TC2 to the central axis CA2 is 9.87 microns.

By arranging the plurality of first sub-pixels 110 in the at least one light-transmitting column unit into a curved arrangement structure, relative positions of the first sub-pixels 110 can be optimized, such that the diffraction effect on light of the light-transmitting display panel 100 can be reduced, and the quality of images obtained by the photosensitive components integrated on the back of the light-transmitting display panel 100 can be further improved.

In some embodiments, a distance from a first sub-pixel 110 that is set to deviate from a central axis to the central axis ranges from 3 to 35 microns. The first sub-pixels 110 may include red sub-pixels, green sub-pixels, and blue sub-pixels. When a red sub-pixel is set to deviate from a central axis, a distance from its center point to the corresponding central axis ranges from 3 to 35 microns. When a green sub-pixel is set to deviate from a central axis, a distance from its center point to the corresponding central axis ranges from 3 to 30 microns. When a blue sub-pixel is set to deviate from a central axis, a distance from its center point to the corresponding central axis ranges from 3 to 30 microns.

In some embodiments, in the first minimum repeating unit RU1, the plurality of first sub-pixels 110 of at least two light-transmitting column units TC1, TC2 are arranged in an arcuate arrangement structure. Arcuate arrangement structures respectively corresponding to the light-transmitting column units TC1, TC2 have a same arcuate convex direction. For example, in this embodiment, the plurality of first sub-pixels 110 of the first light-transmitting column unit TC1 are arranged in a first arcuate arrangement structure AS1, the plurality of first sub-pixels 110 of the second light-transmitting column unit TC2 are arranged in a second arcuate arrangement structure AS2, and an arcuate convex direction of the first arcuate arrangement structure AS1 and an arcuate convex direction of the second arcuate arrangement structure AS2 are both leftward.

In some embodiments, in the first minimum repeating unit RU1, the plurality of first sub-pixels 110 of the at least two light-transmitting column units TC1, TC2 are arranged in an arcuate arrangement structure. Arcuate arrangement structures respectively corresponding to the light-transmitting column units of the light-transmitting column units TC1, TC2 are different from each other. For example, in this embodiment, the first arcuate arrangement structure AS1 and the second arcuate arrangement structure AS2 are not completely the same as each other in shape.

Figure 3:
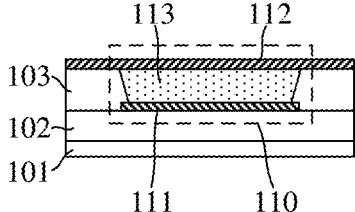
FIG. 3 is a schematic cross-sectional view along a Z-Z direction shown in FIG. 2.

FIG. 3 is a schematic cross-sectional view along a Z-Z direction shown in FIG. 2. The light-transmitting display panel 100 includes a substrate 101, a device layer 102 and a pixel definition layer 103. The device layer 102 is disposed on the substrate 101, and the pixel definition layer 103 is disposed on the device layer 102. The substrate 101 may be made of light-transmitting materials such as glass, polyimide (Polyimide, PI, or the like. The device layer 102 may include pixel circuits for driving respective sub-pixels to display. The pixel defining layer 103 may include pixel openings.

Each first sub-pixel 110 includes a first electrode 111 disposed on the substrate 101, a first light-emitting structure 112 disposed on the first electrode 111, and a second electrode 113 disposed on the first light-emitting structure 112. The first electrode 111 is disposed on the device layer 102 and may be electrically connected to the pixel circuits in the device layer 102. The first light-emitting structure 112 may be disposed in a corresponding pixel opening.

In some embodiments, the first electrode 111 may be a reflective electrode, so as to improve a display effect of the formed first sub-pixel 110. The reflective electrode includes a first light-transmitting conductive layer, a reflective layer disposed on the first light-transmitting conductive layer, and a second light-transmitting conductive layer disposed on the reflective layer. The first light-transmitting conductive layer and the second light-transmitting conductive layer may be indium tin oxide (Indium Tin Oxide, ITO) layers or indium zinc oxide (Indium Zinc Oxide, IZO) layers, etc., and the reflective layer may be a metal layer, such as being made of silver.

The second electrode 113 may be a magnesium-silver alloy layer.

The first light-emitting structure 112 may include an emitting layer (Emitting Layer, EML). According to design requirements of the first light-emitting structure 112, the first light-emitting structure 112 may further include at least one of a hole inject layer (Hole Inject Layer, HIL), a hole transport layer (Hole Transport Layer, HTL), and an electron inject layer (Electron Inject Layer, EIL), or an electron transport layer (Electron Transport Layer, ETL).

In some embodiments, an orthographic projection of each first electrode 111 on the substrate 101 may comprise one first graphic unit or two or more first graphic units connected together. The first graphic unit may include at least one selected from a group of a circle, an oval, a dumbbell shape, a gourd shape, and a rectangle. For example, in this embodiment, the orthographic projection of the first electrode 111 on the substrate 101 is a rectangle.

In some embodiments, an orthographic projection of each first light-emitting structure 112 on the substrate 101 may comprises one second graphic unit or two or more second graphic units connected together. The second graphic unit include at least one selected from a group of a circle, an oval, a dumbbell shape, a gourd shape, and a rectangle. For example, in this embodiment, the orthographic projection of the first light light-emitting structure 112 on the substrate 101 is a rectangle.

In some embodiments, a length of the first electrode 111 in a direction parallel to the central axis CA is 10 to 35 microns, and a length of the first electrode 111 in a direction perpendicular to the central axis CA is 10 to 35 microns.

By setting a shape of the first electrode 111 properly and controlling a size of the first electrode 111 within a preset range, the size of the first electrode 111 can be reduced while the display effect can be guaranteed. As a result, the diffraction phenomenon on light of the light-transmitting display panel 100 can be reduced.

Figure 4:
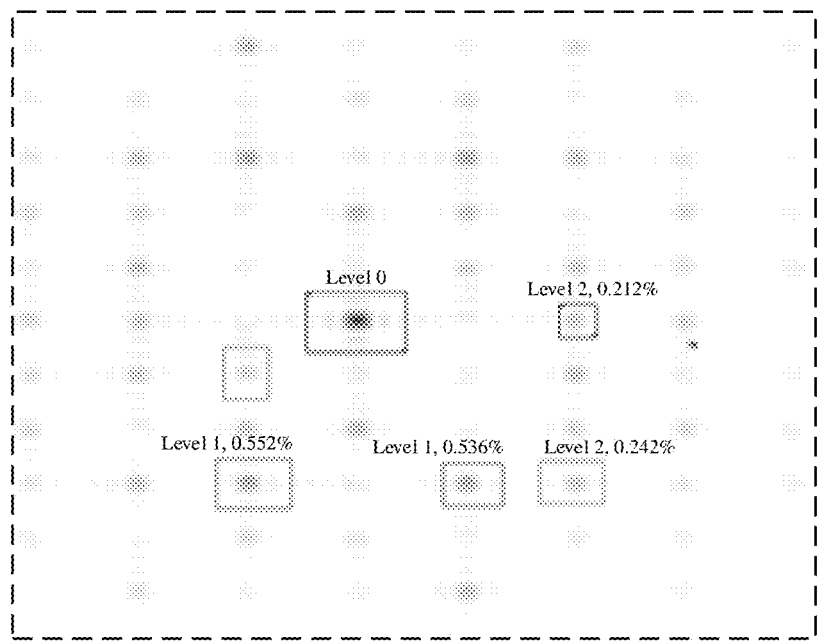
FIG. 4 is a diagram showing energy distribution of diffraction spots generated by performing diffraction detection on the light-transmitting display panel provided by the embodiment of the present application.

FIG. 4 is a diagram showing energy distribution of diffraction spots generated by performing diffraction detection on the light-transmitting display panel 100 provided by the embodiment of the present application. FIG. 4 shows the energy distribution of diffraction spots on a part of the light-transmitting display panel 100.

In order to clearly show the optimized effect on diffraction spots of the light-transmitting display panel 100 provided by the embodiment of the present application, a comparative embodiment is shown below for illustration.

Figure 5:
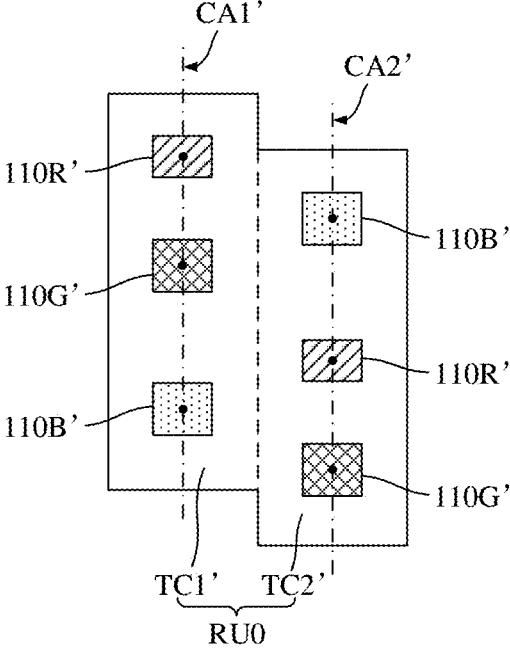
FIG. 5 is a schematic structural diagram of a comparative minimum repeating unit in a pixel array included in a light-transmitting display panel provided by a comparative embodiment.

FIG. 5 is a schematic structural diagram of a comparative minimum repeating unit in a pixel array included in a light-transmitting display panel provided by the comparative embodiment. Column units included in the comparative minimum repeating unit RU0 are the same as the light-transmitting column units included in first minimum repeating unit RU1 of the foregoing embodiment, in number, shape and size. Sub-pixels in each column unit are the same as the first sub-pixels 110 in the corresponding light-transmitting column unit, in number and color.

The comparative minimum repeating unit RU0 includes a first column unit TC1' and a second column unit TC2'. The first column unit TC1' has a central axis CA1' parallel to an extending direction of the first column unit TC1', and the second column unit TC2' has a central axis CA2' parallel to an extending direction of the second column cell TC2'. Comparative pixels 110R', 110G', 110B' in the first column unit TC1' are all located along the central axis CA1', and comparative pixels 110B', 110R', 110G' in the second column unit TC2' are all located along the central axis CA2'. The other structures of the comparative minimum repeating unit RU0 are substantially the same as those of the first minimum repeating unit RU1 of the foregoing embodiment.

Figure 6:
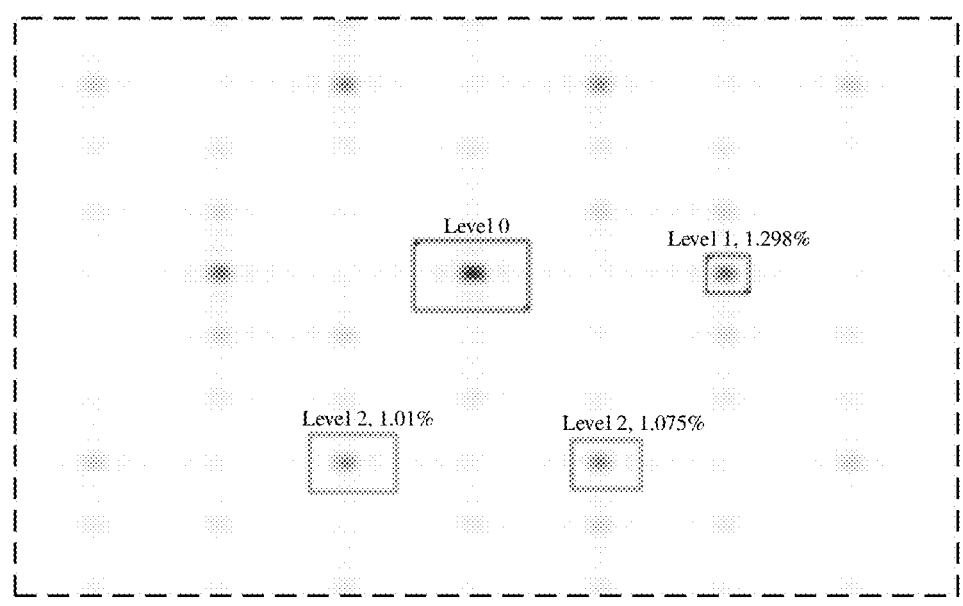
FIG. 6 is a diagram showing energy distribution of diffraction spots generated by performing diffraction detection on the light-transmitting display panel provided by the comparative embodiment.

FIG. 6 is a diagram showing energy distribution of diffraction spots generated by performing diffraction detection on the light-transmitting display panel provided by the comparative embodiment. FIG. 6 shows the energy distribution of diffraction spots on a part of the light-transmitting display panel provided by the comparative embodiment.

According to FIG. 4 and FIG. 6, in the energy distribution diagram of the diffraction spots of the light-transmitting display panel provided by the comparative embodiment, a ratio of energy of level 1 of a diffraction spot to energy of level 0 of a diffraction spot is 1.298%, ratios of energy of level 2 of two diffraction spots to energy of level 0 of diffraction spot are 1.01%, 1.075%, respectively. However, in the energy distribution diagram of the diffraction spots of the light-transmitting display panel provided by the foregoing embodiment, ratios of energy of level 1 of two diffraction spots to energy of level 0 of a diffraction spot are 0.536%, 0.552%, respectively, and ratios of energy of level 2 of two diffraction spots to energy of level 0 of a diffraction spot are 0.212%, 0.242%, respectively. As can be seen, the quality of images obtained by the photosensitive components integrated on the back of the light-transmitting display panel 100 can be further improved, by optimizing relative positions of the first sub-pixels 110 to reduce the diffraction effect on light of the light-transmitting display panel 100.

It can be understood that it may not be limited to the example case of the foregoing embodiment in which at least one first sub-pixels 110 in the at least one light-transmitting column unit is set to deviate from the central axis, and a variety of implementations may be obtained by a combination of selecting which of the first sub-pixels 110 to be deviated, setting a deviation direction and setting a deviation distance.

Figure 7:
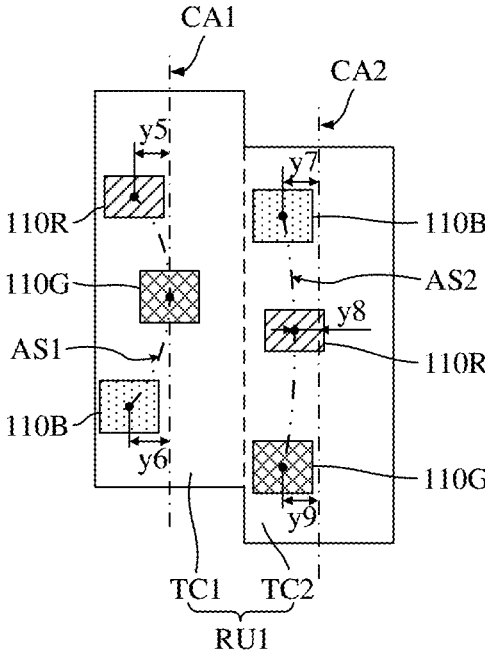
FIG. 7 a schematic enlarged view of a first minimum repeating unit of a light-transmitting display panel provided by an alternative embodiment of the present application.

FIG. 7 a schematic enlarged view of a first minimum repeating unit of a light-transmitting display panel provided by an alternative embodiment of the present application. In the alternative embodiment, the first minimum repeating unit RU1 includes a first light-transmitting column unit TC1 and a second light-transmitting column unit TC2. The first light-transmitting column unit TC1 has a central axis CA1 parallel to an extending direction of the first light-transmitting column unit TC1, and the second light-transmitting column unit TC2 has a central axis CA2 parallel to an extending direction of the second light-transmitting column unit TC2.

The first light-transmitting column unit TC1 includes a first sub-pixel 110R, a first sub-pixel 110G, and a first sub-pixel 110B that are spaced from one another in the extending direction of the first light-transmitting column unit TC1. Among the sub-pixels, the first sub-pixel 110R is a red sub-pixel, the first sub-pixel 110G is a green sub-pixel, and the first sub-pixel 110B is a blue sub-pixel. In the first light-transmitting column unit TC1, the first sub-pixel 110R and the first sub-pixel 110B are set to deviate from the central axis CA1. Particularly, as shown in FIG. 7, the first sub-pixel 110R is set to deviate leftward from the central axis CA1, and a distance y5 from the first sub-pixel 110R of the first light-transmitting column unit TC1 to the central axis CA1 is 12.13 microns. The first sub-pixel 110B is set to deviate leftward from the central axis CA1, and a distance y6 from the first sub-pixel 110B of the first light-transmitting column unit TC1 to the central axis CA1 is 11.37 microns.

In this embodiment, the second light-transmitting column unit TC2 includes a first sub-pixel 110B, a first sub-pixel 110R, and first sub-pixel 110G that are spaced from one another in the extending direction of the second light-transmitting column unit TC2. Among the sub-pixels, the first sub-pixel 110R is a red sub-pixel, the first sub-pixel 110G is a green sub-pixel, and the first sub-pixel 110B is a blue sub-pixel. In the second light-transmitting column unit TC2, the first sub-pixel 110B, the first sub-pixel 110R, and the first sub-pixel 110G are all are all set to deviate from the central axis CA2. Particularly, as shown in FIG. 7, the first sub-pixel 110B is set to deviate leftward from the central axis CA2, and a distance y7 from the first sub-pixel 110B of the second light-transmitting column unit TC2 to the central axis CA2 is 12.62 microns. The first sub-pixel 110R is set to deviate leftward from the central axis CA2, and a distance y8 from the first sub-pixel 110R of the second light-transmitting column unit TC2 to the central axis CA2 is 9.87 microns. The first sub-pixel 110G is set to deviate leftward from the central axis CA2, and a distance y9 from the first sub-pixel 110G of the second light-transmitting column unit TC2 to the central axis CA2 is 11.63 microns.

The plurality of first sub-pixels 110 of the first light-transmitting column unit TC1 are arranged in a first arcuate arrangement structure AS1, and the plurality of first sub-pixels 110 of the second light-transmitting column unit TC2 are arranged in a second arcuate arrangement structure AS2. Arcuate arrangement structures respectively corresponding to the light-transmitting column units TC1, TC2 have a same arcuate convex direction. In an alternative embodiment, an arcuate convex direction of the first arcuate arrangement structure AS1 and an arcuate convex direction of the second arcuate arrangement structure AS2 are both rightward.

Figure 8:
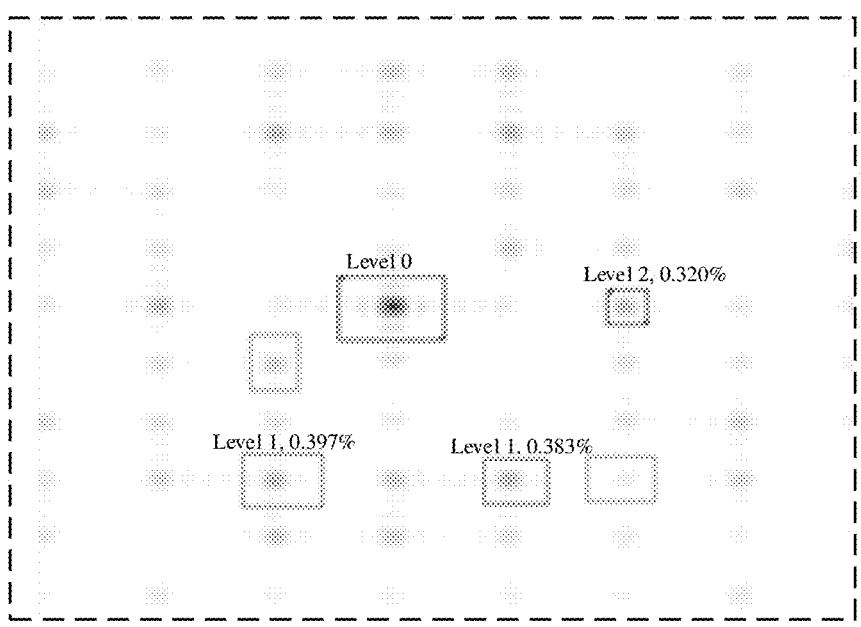
FIG. 8 is a diagram showing energy distribution of diffraction spots generated by performing diffraction detection on a light-transmitting display panel provided by an alternative embodiment of the present application.

FIG. 8 is a diagram showing energy distribution of diffraction spots generated by performing diffraction detection on the light-transmitting display panel provided by the alternative embodiment of the present application. FIG. 8 shows the energy distribution of diffraction spots on a part of the light-transmitting display panel provided by the alternative embodiment.

According to FIG. 8 (the alternative embodiment) and FIG. 6 (the comparative embodiment), in the energy distribution diagram of the diffraction spots of the light-transmitting display panel provided by the alternative embodiment, ratios of energy of level 1 of two diffraction spots to energy of level 0 of a diffraction spot are 0.383%, 0.397%, respectively, and a ratio of energy of level 2 of a diffraction spot to energy of level 0 of diffraction spot is 0.320%. As can be seen, the quality of images obtained by the photosensitive components integrated on the back of the light-transmitting display panel 100 can be further improved, by arranging the plurality of first sub-pixels 110 in the at least one light-transmitting column unit in an arcuate arrangement structure, so as to optimize relative positions of the first sub-pixels 110 and thus reduce the diffraction effect on light of the light-transmitting display panel 100.

Embodiment of the present application also provides a display panel. The display panel of the embodiments of the present application will be described below.

Figure 9:
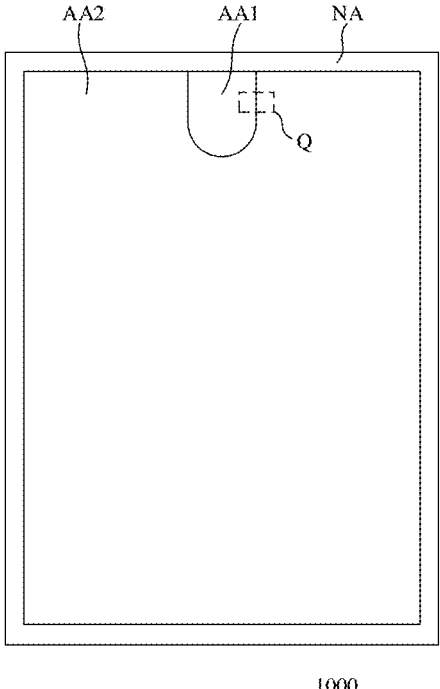
FIG. 9 is a schematic top view of a display panel provided by an embodiment of the present application.

FIG. 9 is a schematic top view of a display panel provided by an embodiment of the present application. The display panel 1000 has a first display area AA1 and a second display area AA2 adjacent to one another. In some embodiments, the display panel 1000 may further include a non-display area NA surrounding the first display area AA1 and the second display area AA2. A light transmittance of the first display area AA1 is greater than a light transmittance of the second display area AA2. The first display area AA1 of the display panel 1000 may be configured as the light-transmitting display panel 100 provided according to any one of the foregoing embodiments of the present application. In this embodiment, it is used as an example for illustration that the first display area AA1 of the display panel 1000 is configured as the light-transmitting display panel 100 provided in the foregoing embodiment of the present application.

Figure 10:
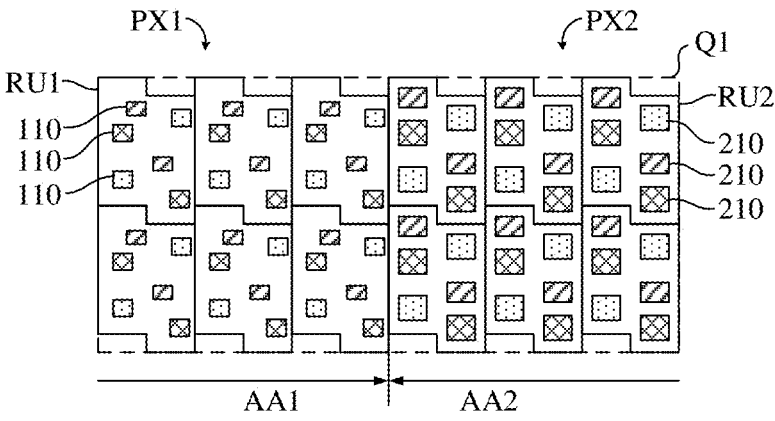
FIG. 10 is a schematic enlarged partial view of a Q region shown in FIG. 9.

FIG. 10 is a schematic enlarged partial view of a Q region shown in FIG. 9. The display panel 1000 includes a first pixel array PX1 in the first display area AA1, and the first pixel array PX1 includes a first minimum repeating unit RU1. A structure of the first minimum repeat unit RU1 in this embodiment may refer to FIG. 2. The first minimum repeating unit RU1 includes at least one light-transmitting column unit TC1, TC2. In this embodiment, it is used as an example for illustration that the first minimum repeating unit RU1 includes a first light-transmitting column unit TC1 and a second light-transmitting column unit TC2.

Each of the light-transmitting column units TC1, TC2 has a central axis CA1, CA2 parallel to an extending direction of the light-transmitting column unit TC1, TC2, and each of the light-transmitting column units TC1, TC2 includes a plurality of sub-pixels 110 spaced from one another in the extending direction of the first light-transmitting column unit TC1, TC2. For example, in this embodiment, the first light-transmitting column unit TC1 has a central axis CA1 parallel to the extending direction of the first light-transmitting column unit TC1, and the second light-transmitting column unit TC2 has a central axis CA2 parallel to the extending direction parallel to the second light-transmitting column unit TC2.

According to the display panel 1000 of the embodiment of the present application, the light transmittance of the first display area AA1 is greater than the light transmittance of the second display area AA2, so that the display panel 1000 may achieve under-screen integration of photosensitive components such as cameras by integrating the photosensitive components on the back of the first display area AA1, while the first display area AA1 can display pictures. Therefore, an area of display of the display panel 1000 can be increased and a full-screen design of a display apparatus can be achieved.

In the first minimum repeating unit RU1, at least one of the first sub-pixels 110 in the at least one light-transmitting column unit is set to deviate from the central axis, so as to avoid a strictly and neatly collinear arrangement of each column of first sub-pixels 110 in the first pixel array PX1 and reduce arrangement consistency of the first sub-pixels 110, and thus to reduce a diffraction effect on light of the first display area AA1 of the light-transmitting display panel 1000. The quality of images obtained by the photosensitive components integrated on the back of the first display area AA1 can be improved, and the resolution and contrast of the images obtained by the photosensitive components can be improved, by reducing the diffraction effect on light of the first display area AA1.

In this embodiment, the display panel 1000 may further include a second pixel array PX2 disposed in the second display area AA2. The second pixel array PX2 includes a second minimum repeating unit RU2.

Figure 11:
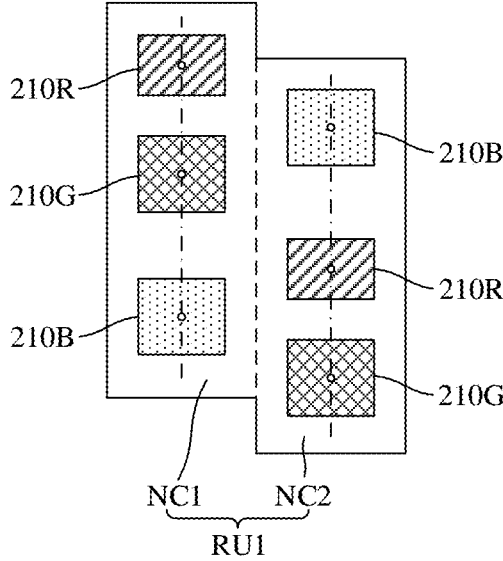
FIG. 11 is a schematic enlarged view of a first minimum repeating unit of the light-transmitting display panel provided by the embodiment of the present application.

FIG. 11 is a schematic enlarged view of a first minimum repeating unit of the light-transmitting display panel provided by the embodiment of the present application. The second minimum repeating unit RU2 may include at least one opaque column unit NC1, NC2. Each opaque column unit NC1, NC2 may include a plurality of second sub-pixels spaced from one another in an extending direction of the opaque column unit NC1, NC2 210. The extending direction of the opaque column units NC1, NC2 is identical to the extending direction of the light-transmitting column units TC1, TC2.

In this embodiment, the plurality of second sub-pixels 210 included in each opaque column unit are set collinearly in the extending direction of the opaque column unit. In FIG. 11, each of center points of the second sub-pixels 210 is shown as a hollow dot. A number of the opaque column units NC1, NC2 in the second minimum repeating unit RU2 is identical to a number of the light-transmitting column units TC1, TC2 in the first minimum repeating unit RU1, and each opaque column unit NC1, NC2 and corresponding one of the light-transmitting column units TC1, TC2 have a same shape. In this embodiment, the second minimum repeating unit RU2 includes the first opaque column unit NC1 and the second opaque column unit NC2. The first opaque column unit NC1 corresponds to and has the same shape as the first light-transmitting column unit TC1. The second opaque column unit NC2 corresponds to and has the same shape as the second light-transmitting column unit TC2.

In the corresponding light-transmitting column unit TC1, TC2 and opaque column unit NC1, NC2, the plurality of first sub-pixels 110 and the plurality of second sub-pixels 210 have the same color sequence.

In this embodiment, the first light-transmitting column unit TC1 includes a first sub-pixel 110R, a first sub-pixel 110G, and a first sub-pixel 110B that are spaced from one another in the extending direction of the first light-transmitting column unit TC1. Among the sub-pixels, the first sub-pixel 110R is a red sub-pixel, the first sub-pixel 110G is a green sub-pixel, and the first sub-pixel 110B is a blue sub-pixel. The first opaque column unit NC1 includes a second sub-pixel 210R, a second sub-pixel 210G, and a second sub-pixel 210B that are spaced apart from each one other in the extending direction of the first opaque column unit NC1. Among the sub-pixels, the second sub-pixel 210R is a red sub-pixel, the second sub-pixel 210G is a green sub-pixel, and the second sub-pixel 210B is a blue sub-pixel. That is, in the first light-transmitting column unit TC1 and the first opaque column unit NC1, the color sequence is red, green, and blue.

In this embodiment, the second light-transmitting column unit TC2 includes a first sub-pixel 110B, a first sub-pixel 110R, and a first sub-pixel 110G that are spaced apart from one another in the extending direction of the second light-transmitting column unit TC2. Among the sub-pixels, the first sub-pixel 110R is a red sub-pixel, the first sub-pixel 110G is a green sub-pixel, and the first sub-pixel 110B is a blue sub-pixel. The second opaque column unit NC2 includes a second sub-pixel 210B, a second sub-pixel 210R, and a second sub-pixel 210G that are spaced apart from one another in the extending direction of the second opaque column unit NC2. Among the sub-pixels, the second sub-pixel 210R is a red sub-pixel, the second sub-pixel 210G is a green sub-pixel, and the second sub-pixel 210B is a blue sub-pixel. That is, in the second light-transmitting column unit TC2 and the second opaque column unit NC2, the color sequence is blue, red, and green.

Figure 12:
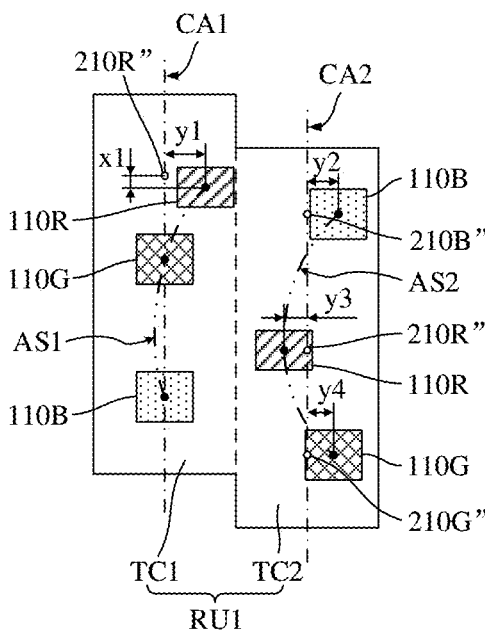
FIG. 12 is a schematic projection diagram when a second minimum repeating unit is projected to a first minimum repeating unit in the light-transmitting display panel provided by the embodiment of the present application.

FIG. 12 is a schematic projection diagram when the second minimum repeating unit is projected to the first minimum repeating unit in the display panel provided by the embodiment of the present application. In FIG. 12, each of center points of first sub-pixels 110 is shown as a solid dot, and a projection of each of center points of second sub-pixels 210 on a first minimum repeating unit RU1 is shown as a hollow dot. 210R″, 210G″ and 210B″ represent projection of a center of a second sub-pixel 210R, a center of a second sub-pixel 210G, and a center of a second sub-pixel 210B on the first minimum repeating unit RU1, respectively.

In some embodiments, projection profiles of the opaque column unit NC1, NC2 coincide with profiles of corresponding light-transmitting column unit TC1, TC2, when the second minimum repeating unit RU2 is projected to the first minimum repeating unit RU1. At least one of the first sub-pixels 110 and a projection of a second sub-pixel at a position corresponding to the second sub-pixel 210 in the color sequence deviate from each other in a direction parallel to the central axis.

In the description, the first sub-pixel 110 and the second sub-pixel 210 at the positions corresponding to each other in the color sequence may be understood as follows. The first light-transmitting column unit TC1 and the corresponding first opaque column unit NC1 are taken as examples, in which the color sequence is red, green and blue. A first sub-pixel at the red position in the color sequence is the first sub-pixel 110R, and a second sub-pixel at the red position in the color sequence is the second sub-pixel 210R. In this case, the first sub-pixel 110R and the second sub-pixel 210R are the first sub-pixel 110 and the second sub-pixel 210 at the positions corresponding to each other in the color sequence. Other first sub-pixels 110 and second sub-pixels 210 at the positions corresponding to each other in the color sequence may be obtained similarly based on this rule.

In this embodiment, the first sub-pixel 110R of the first light-transmitting column unit TC1 in the first minimum repeating unit RU1 deviates downward from the projection 210R″ of the second sub-pixel 210R of the corresponding first opaque column unit NC1 in the direction parallel to the central axis CA1, and a deviation distance x1 is 10.71 microns. Other first sub-pixels 110 of the first minimum repeating unit RU1 do not deviate from projections of corresponding second sub-pixels 210.

In some embodiments, a deviation distance between a projection of a first sub-pixel 110 and a projection of the corresponding second sub-pixel 210 deviating from each other in the direction parallel to the central axis CA ranges from 3 to 35 microns.

In this embodiment, the plurality of first sub-pixels 110 of the first light-transmitting column unit TC1 are arranged in a first arcuate arrangement structure AS1, and the plurality of first sub-pixels 110 of the second light-transmitting column unit TC2 are arranged in a second arcuate arrangement structure AS2. Convex directions of the first arcuate arrangement structure AS1 and the second arcuate arrangement structure AS2 are both leftward.

Figure 13:
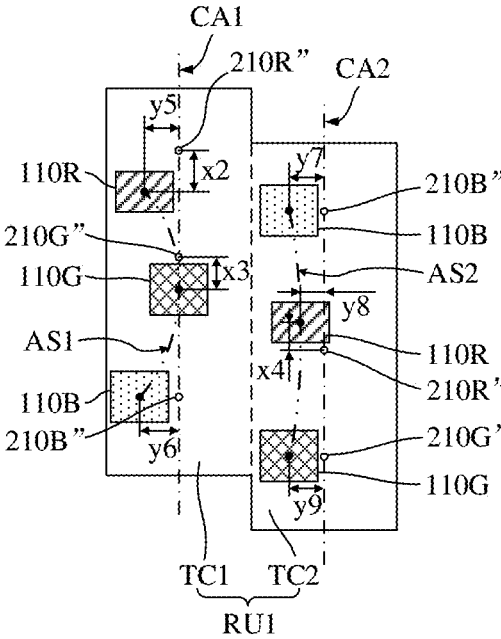
FIG. 13 is a schematic projection diagram when a second minimum repeating unit is projected to a first minimum repeating unit in a light-transmitting display panel provided by an alternative embodiment of the present application.

FIG. 13 is a schematic projection diagram when a second minimum repeating unit is projected to a first minimum repeating unit in a light-transmitting display panel provided by an alternative embodiment of the present application. FIG. 13 involves a first minimum repeating unit that may be the first minimum repeating unit in the light-transmitting display panel provided by the alternative embodiment of the present application in FIG. 7. In FIG. 13, each of center points of first sub-pixels 110 is shown as a solid dot, and a projection of each of center points of second sub-pixels 210 on a first minimum repeating unit RU1 is shown as a hollow dot. 210R″, 210G″ and 210B″ represent projection of a center of a second sub-pixel 210R, a center of a second sub-pixel 210G, and a center of a second sub-pixel 210B on the first minimum repeating unit RU1, respectively.

In the alternative embodiment, in a first light-transmitting column unit TC1 and a first opaque column unit NC1, the color sequence is red, green and blue. In a second light-transmitting column unit TC2 and a second opaque column unit NC2, the color sequence is blue, red and green.

A first sub-pixel 110R of the first light-transmitting column unit TC1 deviates downward from the projection 210R″ of the second sub-pixel 210R of the corresponding first opaque column unit NC1 in a direction parallel to a central axis CA1, and a deviation distance x2 is 10.71 microns. A first sub-pixel 110G of the first light-transmitting column unit TC1 deviates downward from the projection 210G″ of the second sub-pixel 210G of the corresponding first opaque column unit NC1 in the direction parallel to the central axis CA1, and a deviation distance x3 is 10 microns. A first sub-pixel 110B of the first light-transmitting column unit TC1 does not deviate from the projection 210B″ of the second sub-pixel 210B of the corresponding first opaque column unit NC1 in the direction parallel to the central axis CA1.

A first sub-pixel 110B of the second light-transmitting column unit TC2 does not deviate from the projection 210B″ of the second sub-pixel 210B of the corresponding second opaque column unit NC2 in a direction parallel to a central axis CA2. A first sub-pixel 110R of the second light-transmitting column unit TC2 deviates upward from the projection 210R″ of the second sub-pixel 210R of the corresponding second opaque column unit NC2 in the direction parallel to the central axis CA2, and a deviation distance x4 is 9.43 microns. A first sub-pixel 110G of the second light-transmitting column unit TC2 does not deviate from the projection 210G″ of the second sub-pixel 210G of the corresponding second opaque column unit NC2 in the direction parallel to the central axis CA2.

In this embodiment, the plurality of first sub-pixels 110 of the first light-transmitting column unit TC1 are arranged in a first arcuate arrangement structure AS1, and the plurality of first sub-pixels 110 of the second light-transmitting column unit TC2 are arranged in a second arcuate arrangement structure AS2. Convex directions of the first arcuate arrangement structure AS1 and the second arcuate arrangement structure AS2 are both rightward.

The quality of images obtained by photosensitive components integrated on the back of the first display area AA1 of the light-transmitting display panel 100 can be further improved, by arranging the plurality of first sub-pixels 110 in the at least one light-transmitting column unit in an arcuate arrangement structure, so as to optimize relative positions of the first sub-pixels 110 and thus reduce the diffraction effect on light of the first display area AA1.

An embodiment of the present application further provides a display apparatus, which may include the light-transmitting display panel 100 of any of the foregoing embodiments. The light-transmitting display panel 100 includes a display surface and a non-display surface opposite to the display surface. In some embodiments, the display apparatus may further include photosensitive components disposed on the side of the non-display surface of the light-transmitting display panel 100.

The photosensitive components may be apparatuses for image acquisition that may be used to acquire external image information. In this embodiment, the photosensitive components are complementary metal oxide semiconductor (Complementary Metal Oxide Semiconductor, CMOS) apparatuses for image acquisition, and in some other embodiments, the photosensitive components may be other types of apparatuses for image acquisition, such as charge-coupled device (Charge-coupled Device, CCD) apparatuses for image acquisition. It may be understood that the photosensitive components may not be limited to the apparatuses for image acquisition, and in some embodiments, the photosensitive components may be light sensors such as infrared sensors or proximity sensors etc., for example.

According to the display apparatus of the embodiment of the present application, photosensitive components may be integrated on the non-display surface of the light-transmitting display panel 100, to achieve under-screen integration of the photosensitive components such as apparatuses for image acquisition, while the light-transmitting display panel 100 can display pictures, so as to achieve a full-screen design of the display apparatus The light-transmitting display panel 100 may include a first pixel array PX1, which may include a first minimum repeating unit RU1. The first minimum repeating unit RU1 may include at least one light-transmitting column unit TC1, TC2. Each light-transmitting column unit TC1, TC2 may have a central axis CA1, CA2 parallel to an extending direction of the light-transmitting column unit TC1, TC2. Each light-transmitting column unit TC1, TC2 may include a plurality of first sub-pixels 110 spaced from one another in the extending direction of the first light-transmitting column unit TC1, TC2. At least one of the first sub-pixels 110 in the at least one light-transmitting column unit is set to deviate from the central axis.

According to the display device of the embodiment of the present application, a strictly and neatly collinear arrangement of each column of first sub-pixels 110 in the first pixel array PX1 can be avoided and arrangement consistency of the first sub-pixels 110 can be reduced, and thereby a diffraction effect on light of the light-transmitting display panel 100 can be reduced. The quality of images obtained by the photosensitive components integrated on the back of the light-transmitting display panel 100 can be improved, and the resolution and contrast of the images obtained by the photosensitive components can be improved, by reducing the diffraction effect on light of the light-transmitting display panel 100.

In some embodiments, the plurality of first sub-pixels 110 in the at least one light-transmitting column unit are arranged into a curved arrangement structure, and thereby the diffraction effect on light of the light-transmitting display panel 100 can be reduced by optimizing relative positions of the first sub-pixels 110, so as to further improve the quality of images obtained by the photosensitive components in the display apparatus.

According to the above-mentioned embodiments of the present application, these embodiments do not describe all details exhaustively, nor do they limit the application to only the specific embodiments described. Obviously, according to the above description, many modifications and changes can be made. This specification selects and describes these embodiments in details, in order to better explain principles and practical applications of this application, such that those skilled in the art can make good use of this application and make modifications on the basis of this application. This application is only limited by the claims and their full scope and equivalents.

What is claimed is:

1. A light-transmitting display panel, comprising:
   a first pixel array comprising a first minimum repeating unit, the first minimum repeating unit comprising at least one light-transmitting column unit, the at least one light-transmitting column unit having a central axis parallel to an extending direction of the at least one light-transmitting column unit and comprising a plurality of first sub-pixels spaced apart from one another in the extending direction of the at least one light-transmitting column unit, wherein in the first minimum repeating unit, the at least one light-transmitting column unit comprises a first light-transmitting column unit having a first part of the plurality of first sub-pixels and a second light-transmitting column unit having a second part of the plurality of first sub-pixels, both parts of the plurality of first sub-pixels are arranged in a respective arcuate arrangement structure, and a first arcuate arrangement structure of the first part of the plurality of first sub-pixels in the first light-transmitting column unit differs in shape from a second arcuate arrangement structure of the second part of the plurality of first sub-pixels in the second light-transmitting column unit.

2. The light-transmitting display panel of claim 1, wherein the plurality of first sub-pixels in the at least one light-transmitting column unit are arranged in a curved arrangement structure.

3. The light-transmitting display panel of claim 1, wherein the plurality of first sub-pixels in the at least one light-transmitting column units are arranged in an arcuate arrangement structure.

4. The light-transmitting display panel of claim 1, wherein in the first minimum repeating unit, the at least one light-transmitting column unit comprises at least two light-transmitting column units, the plurality of first sub-pixels in each of the at least two light-transmitting column units are respectively arranged in an arcuate arrangement structure, and wherein the arcuate arrangement structures of the at least two light-transmitting column units have a same arcuate convex direction.

5. The light-transmitting display panel of claim 1, wherein in the first minimum repeating unit, the at least one light-transmitting column unit comprises at least two light-transmitting column units, the plurality of first sub-pixels in the at least two light-transmitting column units are respectively arranged in an arcuate arrangement structure, and wherein the arcuate arrangement structures corresponding to the light-transmitting column units of the at least two light-transmitting column units are different from each other.

6. The light-transmitting display panel of claim 1, wherein a distance from the first sub-pixels set to deviate from the central axis to the central axis ranges from 3 to 35 microns.

7. The light-transmitting display panel of claim 1, wherein the light-transmitting display panel comprises a substrate, each of the first sub-pixels comprises a first electrode disposed on the substrate, a first light-emitting structure disposed on the first electrode, and a second electrode disposed on the first light-emitting structure.

8. The light-transmitting display panel of claim 7, wherein an orthographic projection of each first electrode on the substrate comprises one first graphic unit, or two or more first graphic units connected together, and the first graphic unit comprises at least one selected from a group consisting of a circle, an oval, a dumbbell shape, a gourd shape, and a rectangle.

9. The light-transmitting display panel of claim 8, wherein the orthographic projection of each first electrode on the substrate is a rectangle.

10. The light-transmitting display panel of claim 7, wherein an orthographic projection of each first light-emitting structure on the substrate comprises one second graphic unit, or two or more second graphic units connected together, and the second graphic unit comprises at least one selected from a group consisting of a circle, an oval, a dumbbell shape, a gourd shape, and a rectangle.

11. The light-transmitting display panel of claim 10, wherein the orthographic projection of each first light-emitting structure on the substrate is a rectangle.

12. The light-transmitting display panel of claim 7, wherein a length of the first electrode in a direction parallel to the central axis is 10 to 35 microns, and a length of the first electrode in a direction perpendicular to the central axis is 10 to 35 microns.

13. The light-transmitting display panel of claim 7, wherein the first electrode is a reflective electrode, and the reflective electrode comprises a first light-transmitting conductive layer, a reflective layer disposed on the first light-transmitting conductive layer, and a second light-transmitting conductive layer disposed on the reflective layer.

14. The light-transmitting display panel of claim 13, wherein the first light-transmitting conductive layer and the second light-transmitting conductive layer are indium tin oxide layers or indium zinc oxide layers, the reflective layer is a metal layer, and the second electrode is a magnesium-silver alloy layer.

15. A display panel, comprising a first display area and a second display area adjacent to each other, a light transmittance of the first display area being greater than a light transmittance of the second display area, wherein the first display area of the display panel is configured to be the light-transmitting display panel of claim 1.

16. The display panel of claim 15, further comprising a second pixel array disposed in the second display area, the second pixel array comprises a second minimum repeating unit, the second minimum repeating unit comprises a plurality of opaque column units, each of the opaque column units comprises a plurality of second sub-pixels spaced apart from one another in an extending direction of the opaque column unit, the at least one light-transmitting column unit of the first minimum repeating unit comprises a plurality of light-transmitting column units, the extending direction of the opaque column unit is same as the extending direction of the light-transmitting column unit, and the plurality of second sub-pixels in each of the opaque column units are set collinearly in the extending direction of the opaque column unit, wherein a number of opaque column units in the second minimum repeating unit is identical to a number of light-transmitting column units in the first minimum repeating unit and the light-transmitting column unit and corresponding one of the opaque column unit have a same shape, and in the light-transmitting column unit and the corresponding opaque column unit, the plurality of first sub-pixels and the plurality of second sub-pixels have a same color sequence.

17. The display panel of claim 16, wherein a projection profile of an opaque column unit coincides with a profile of the corresponding light-transmitting column unit, when the second minimum repeating unit is projected to the first minimum repeating unit, and at least one of the first sub-pixels and a projection of a second sub-pixel at a position corresponding to the first sub-pixel in the color sequence deviate from each other in a direction parallel to the central axis.

18. The display panel of claim 17, wherein a deviation distance between the first sub-pixel and the projection of the corresponding second sub-pixel deviating from each other in the direction parallel to the central axis ranges from 3 to 35 microns.

19. The display panel of claim 1, wherein a red first sub-pixel and a blue first sub-pixel, in the at least one light-transmitting column unit, are set to deviate from the central axis, and a green first sub-pixel, is located along the central axis.

* * * * *